United States Patent
Vazzoler

(10) Patent No.: US 9,412,898 B2
(45) Date of Patent: Aug. 9, 2016

(54) APPARATUS AND METHOD OF TESTING A SUBSTRATE USING A SUPPORTING NEST AND TESTING PROBES

(75) Inventor: Michele Vazzoler, Treviso (IT)

(73) Assignee: APPLIED MATERIALS, INC., Santa Clara, CA (US)

( * ) Notice: Subject to any disclaimer, the term of this patent is extended or adjusted under 35 U.S.C. 154(b) by 884 days.

(21) Appl. No.: 13/394,127

(22) PCT Filed: Sep. 2, 2010

(86) PCT No.: PCT/EP2010/062831
§ 371 (c)(1),
(2), (4) Date: May 29, 2012

(87) PCT Pub. No.: WO2011/026875
PCT Pub. Date: Mar. 10, 2011

(65) Prior Publication Data
US 2012/0229156 A1    Sep. 13, 2012

(30) Foreign Application Priority Data
Sep. 3, 2009  (IT) .............................. UD2009A0146

(51) Int. Cl.
*G01R 31/00* (2006.01)
*H01L 31/18* (2006.01)
(Continued)

(52) U.S. Cl.
CPC ........ *H01L 31/1876* (2013.01); *G01R 31/2808* (2013.01); *G01R 31/2893* (2013.01); *H01L 21/67736* (2013.01); *H02S 50/10* (2014.12); *Y02E 10/50* (2013.01); *Y02P 70/521* (2015.11)

(58) Field of Classification Search
CPC ........... G01R 1/07364; G01R 31/2808; G01R 31/2893; H02S 50/10; H01L 31/1876; H01L 21/67736; Y02E 10/50
See application file for complete search history.

(56) References Cited

U.S. PATENT DOCUMENTS

| 4,491,173 A | 1/1985 | Demand |
| 4,561,541 A | 12/1985 | Lawrence |

(Continued)

FOREIGN PATENT DOCUMENTS

| CN | 1769920 A | 5/2006 |
| CN | 1790042 A | 6/2006 |

(Continued)

OTHER PUBLICATIONS

Japanese Office Action dated Apr. 15, 2014 for Application No. 2012-527310.

(Continued)

*Primary Examiner* — Minh N Tang
(74) *Attorney, Agent, or Firm* — Patterson & Sheridan, LLP

(57) ABSTRACT

Embodiments of the invention may provide a testing apparatus that is used to test solar cells or other electronic devices. The testing apparatus may comprise a substantially flat support that is configured to support a substrate or other device that is to be electrically tested and a plurality of testing probes. The support comprises a plurality of through holes, each suitable for the insertion of a corresponding testing probe, to allow each probe to make contact with a testing area formed on the substrate. The testing apparatus may comprise a suction device that is associated or associable with the support, and is able to exert a holding force on the substrate that counteracts the thrusting force exerted by the testing probes.

19 Claims, 8 Drawing Sheets

(51) Int. Cl.
*G01R 31/28* (2006.01)
*H01L 21/677* (2006.01)
*H02S 50/10* (2014.01)

(56) References Cited

U.S. PATENT DOCUMENTS

| | | | | |
|---|---|---|---|---|
| 4,771,234 | A * | 9/1988 | Cook et al. | 324/750.2 |
| 4,814,698 | A * | 3/1989 | St. Onge et al. | 324/754.15 |
| 4,841,231 | A * | 6/1989 | Angelucci | 324/528 |
| 5,027,063 | A * | 6/1991 | Letourneau | 324/750.2 |
| 5,801,543 | A * | 9/1998 | Keune et al. | 324/750.2 |
| 6,660,541 | B2 | 12/2003 | Kanamaru et al. | |
| 6,894,479 | B2 * | 5/2005 | Siefers et al. | 324/754.16 |
| 7,355,418 | B2 * | 4/2008 | Brunner et al. | 324/750.25 |
| 2006/0000806 | A1 | 1/2006 | Golzarian et al. | |
| 2006/0038554 | A1 | 2/2006 | Kurita et al. | |
| 2006/0126050 | A1 | 6/2006 | Momose | |
| 2011/0025344 | A1 * | 2/2011 | Kumagai et al. | 324/555 |

FOREIGN PATENT DOCUMENTS

| | | |
|---|---|---|
| CN | 201233434 Y | 5/2009 |
| CN | 101515016 A | 8/2009 |
| DE | 103 31 565 A1 | 12/2004 |
| EP | 1 647 827 A1 | 4/2006 |
| JP | 63-244643 A | 10/1988 |
| JP | 7-263526 A | 10/1995 |
| JP | 08-029499 | 2/1996 |
| JP | 8-236594 A | 9/1996 |
| JP | 2001-135680 A | 5/2001 |
| JP | 2005-156317 A | 6/2005 |
| JP | 2006225763 A | 8/2006 |
| TW | 286364 B | 9/1996 |
| TW | 290645 B | 11/1996 |
| TW | 200935060 A | 8/2009 |

OTHER PUBLICATIONS

Chinese Search Report dated Feb. 11, 2014, for Application No. 2010800395701.

Italian Search Report and Written Opinion dated Aug. 5, 2010 for International Patent Application IT UD20090146.

Japanese Office Action (with attached English translation) for Application No. 2012-527310 dated Mar. 9, 2015; 6 total pages.

Taiwan Office Action dated Mar. 16, 2016 for Application No. 103126444.

* cited by examiner

APPARATUS AND METHOD OF TESTING A SUBSTRATE USING A SUPPORTING NEST AND TESTING PROBES

CROSS-REFERENCE TO RELATED APPLICATIONS

This application claims benefit of International Patent Application Serial No. PCT/EP2010/062831 filed Sep. 2, 2010, which claims the benefit of Italian Patent Application Serial Number UD2009A000146, filed Sep. 3, 2009, which are both herein incorporated by reference.

BACKGROUND OF THE INVENTION

Field of the Invention and Description of the Related Art

The present invention concerns a testing apparatus and relative method used in a production plant for electronic devices to carry out an electric control, or test of the devices thus made.

In particular, the testing apparatus according to the present invention is used to carry out an electric control of substrates, or wafers, of solar cells, to check for possible defects in the electric pattern or patterns made therein.

Testing apparatuses to test electronic devices, such as substrates or wafers of solar cells, are known, which are normally positioned at the end of a production line of a plant which produces said electronic devices. Here and hereafter specific reference is made to substrates or wafers, made of semi-conductor material of solar cells, but it cannot be excluded that the apparatus according to the present invention can be used for testing other types of electronic devices such as electronic cards, PCB (Printed Circuit Boards) or others.

These known testing apparatuses comprise two beds of needles disposed reciprocally facing between which at least a substrate to be tested is positioned. The substrate is provided on both its sides with a plurality of electric contact areas, connected to an electric pattern made in the substrate itself.

The beds of needles are reciprocally movable between at least a first position in which they allow the insertion of the substrate to be tested between the beds, substantially like a sandwich, and a second position, in which they are disposed so as to allow the needles to contact the corresponding contact areas of both sides of the substrate.

In this way, as well as allowing the effective electric test, by means of tension and/or current measuring in correspondence with said contact areas, the beds of needles disposed in the second position allow to exert a mechanical contrasting action on both sides of the substrate, keeping the substrate in a stable and secure position during the testing.

One disadvantage of these known apparatuses is that, in the case of substrates or wafers made of silicon or other semi-conductor material, the mechanical contrasting action, which is substantially not cushioned, can determine an involuntary and undesired breakage or crack in the fragile structure of the substrate.

Substrates or wafers of the "all back contacts" type are also known, in which all the contact areas are disposed on one side of the substrate, for example the rear side. In this case the testing apparatus provides the presence of a single bed of needles, reciprocally movable with respect to the substrate so as to allow the substrate to be positioned so that each needle is in contact with a corresponding contact area.

This solution, although allowing to avoid unwanted breakages of the substrates during testing, does not allow to always keep the substrate in a stable and secure position during testing. This can lead to one or more needles not making stable contact with the corresponding contact areas of the substrate, and therefore give a negative test result of a substrate which is not in fact defective.

One purpose of the present invention is to make a testing apparatus which allows to maintain the substrates or wafers or other electronic devices to be tested stable in a desired position, avoiding unwanted damage or breakages of the substrates during testing.

Another purpose of the present invention is to perfect a testing method for substrates, or other electronic devices, which allows to keep the substrates or wafers or other electronic devices to be tested stable in a desired position, avoiding unwanted damage and breakages of the substrates during testing.

The Applicant has devised, tested and embodied the present invention to overcome the shortcomings of the state of the art and to obtain these and other purposes and advantages.

SUMMARY OF THE INVENTION

The present invention is set forth and characterized in the independent claims, while the dependent claims describe other characteristics of the invention or variants to the main inventive idea.

In accordance with the above purposes, a testing apparatus can, for example, be used in a production plant for substrates of solar cells, or other electronic devices, to carry out an electric control or test on the devices thus made. The testing apparatus comprises a support, substantially flat, able to support on one of its surfaces, directly or indirectly, at least a substrate or other device to be electrically tested.

The support comprises a plurality of through holes, each suitable for the insertion of a corresponding electric testing probe of the apparatus, to allow the connection and/or contact of each probe with a corresponding test area of the substrate.

According to one feature of the present invention, the testing apparatus comprises suction means associated with the support, and suitable to exert a holding action through depression on one side of the substrate in order to contrast the thrust action exerted by the testing probes on said testing areas.

In this way, it is possible to firmly maintain the substrate or substrates in a predetermined position during testing, allowing an adequate and effective contrasting action to the thrust of the testing probes, acting on the same side of the substrates on which the probes are connected. This prevents the generation of high mechanical stresses, thus allowing to reduce or minimize possible breakages of the substrate.

According to a variant of the present invention the suction means are disposed in cooperation with each through hole of the support. This allows an optimal distribution of the holding action exerted on the substrate depending on the actual thrusting action exerted by the probes.

According to another variant, each substrate is operatively associable with a supporting nest, used for the movement and the transport of the substrate during different steps of production. The supporting nest is provided with a plurality of through openings, each of which is able to cooperate with at least a corresponding hole of the support for the passage of a corresponding test probe.

According to another variant, each nest comprises a suction pipe operatively associable with the suction means to allow to hold the substrate to the supporting nest, and therefore to the support.

The present invention also concerns a method for testing substrates of solar cells and other electronic devices.

The method comprises a step in which a substrate, or other device to be electrically tested, is disposed on a support, substantially flat, comprising a plurality of through holes, each one suitable for the insertion of a corresponding electric testing probe, belonging to a plurality of testing probes.

The method comprises a testing step in which at least some of the testing probes are inserted in a corresponding through hole to be connected and put in contact with a corresponding testing area of the substrate.

According to one feature of the present invention the method comprises a suction step in which, by means of suction means, associated with the support, a holding action through depression is exerted on one side of the substrate in order to contrast the thrusting action exerted by the testing probes on the testing areas in said testing step.

BRIEF DESCRIPTION OF THE DRAWINGS

These and other characteristics of the present invention will become apparent from the following description of a preferential form of embodiment, given as a non-restrictive example with reference to the attached drawings wherein:

FIG. 4A is an enlarged view of particular of FIG. 4;

FIG. 5A is an enlarged view of a particular of FIG. 5;

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

With reference to the attached drawings, a testing apparatus 10 according to the present invention can be used in a plant to produce substrates 150, or wafers, for solar cells, advantageously, but not exclusively, of the "back side contact" type, in which all the metallic contacts for the extraction of converted electric energy are disposed on one single side of the substrate 150. The substrates 150 have a substantially flat structure of a square or rectangular shape.

Figure 1:
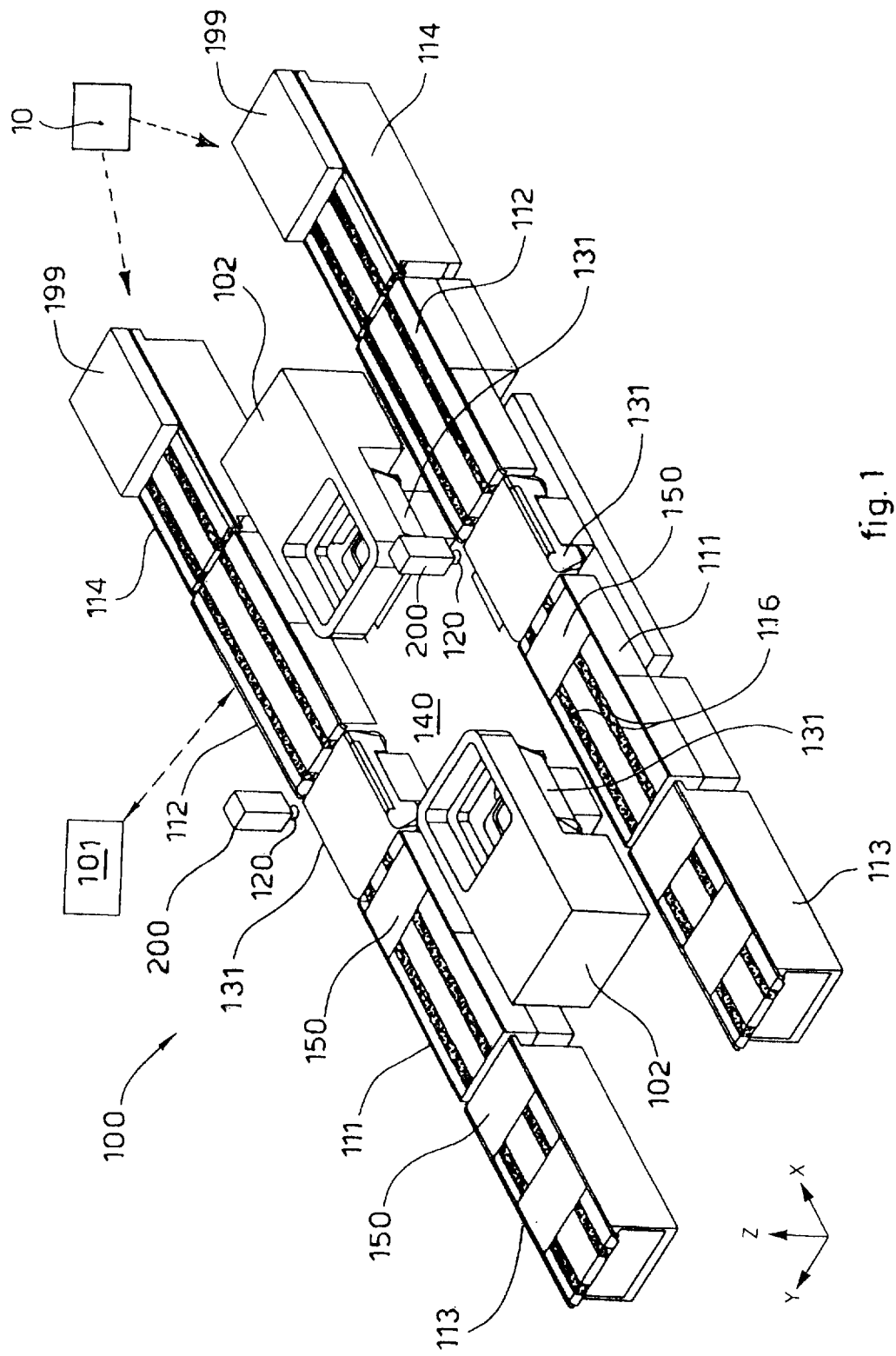
FIG. 1 is a schematic isometric view of a processing system used with embodiments of the present invention.

FIG. 1 is a schematic isometric view of a system 100 for processing substrates 150, associated with an embodiment of the present invention. In one embodiment, the system 100 generally includes two incoming conveyors 111, an actuator assembly 140, a plurality of processing nests 131, a plurality of processing heads 102, two outgoing conveyors 112, and a system controller 101. The incoming conveyors 111 are configured in a parallel processing configuration so that each can receive unprocessed substrates 150 from an input device, such as an input conveyor 113, and transfer each unprocessed substrate 150 to a processing nest 131 coupled to the actuator assembly 140. Additionally, the outgoing conveyors 112 are configured in parallel so that each can receive a processed substrate 150 from a processing nest 131 and transfer each processed substrate 150 to a substrate removal device, such as an exit conveyor 114.

In one embodiment, each exit conveyor 114 is adapted to transport processed substrates 150 through an oven 199 to cure material deposited on the substrate 150 via the processing heads 102.

In one embodiment of the present invention, the system 100 is a screen printing processing system and the processing heads 102 include screen printing components, which are configured to screen print a patterned layer of material on a substrate 150. In another embodiment, the system 100 is an ink jet printing system and the processing heads 102 include ink jet printing components, which are configured to deposit a patterned layer of material on a substrate 150.

Figure 2:
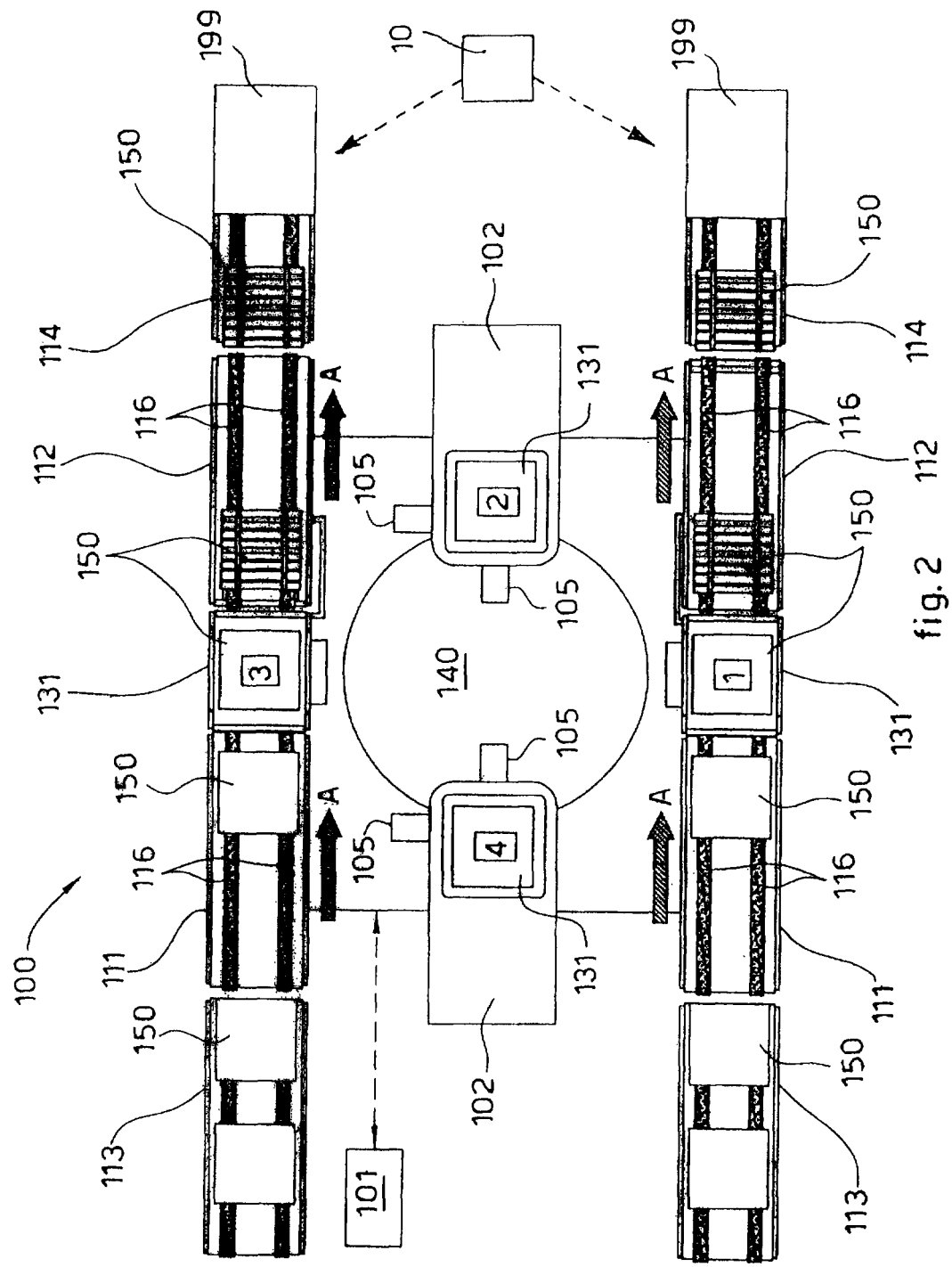
FIG. 2 is a schematic plan view of the system depicted in FIG. 1.

FIG. 2 is a schematic plan view of the system 100 depicted in FIG. 1. FIGS. 1 and 2 illustrate the system 100 having two processing nests 131 (in positions "1" and "3") each positioned to both transfer a processed substrate 150 to the outgoing conveyor 112 and receive an unprocessed substrate 150 from the incoming conveyor 111. Thus, in the system 100, the substrate motion generally follows the path "A" shown in FIGS. 1 and 2. In this configuration, the other two processing nests 131 (in positions "2" and "4") are each positioned under a processing head 102 so that a process (e.g., screen printing, ink jet printing, material removal) can be performed on the unprocessed substrates 150 situated on the respective processing nests 131. Such a parallel processing configuration allows increased processing capacity with a minimized processing system footprint. Although, the system 100 is depicted having two processing heads 102 and four processing nests 131, the system 100 may comprise additional processing heads 102 and/or processing nests 131 without departing from the scope of the present invention.

In one embodiment, the incoming conveyor 111 and outgoing conveyor 112 include at least one belt 116 to support and transport the substrates 150 to a desired position within the system 100 by use of an actuator (not shown) that is in communication with the system controller 101. While FIGS. 1 and 2 generally illustrate a two belt style substrate transferring system, other types of transferring mechanisms may be used to perform the same substrate transferring and positioning functions without varying from the basic scope of the invention.

In one embodiment, the system 100 also includes an inspection system 200, which is adapted to locate and inspect the substrates 150 before and after processing has been performed. The inspection system 200 may include one or more detection means, or cameras 120, that are positioned to inspect a substrate 150 positioned in the loading/unloading positions "1" and "3," as shown in FIGS. 1 and 2.

The inspection system 200 generally includes at least one camera 120 (e.g., CCD camera) and other electronic components that are able to locate, inspect, and communicate the results to the system controller 101. In one embodiment, the inspection system 200 locates the position of certain features of an incoming substrate 150 and communicates the inspection results to the system controller 101 for analysis of the orientation and position of the substrate 150 to assist in the precise positioning of the substrate 150 under a processing head 102 prior to processing the substrate 150.

In one embodiment, the inspection system 200 inspects the substrates 150 so that damaged or mis-processed substrates can be removed from the production line. In one embodiment, the processing nests 131 may each contain a lamp, or other similar optical radiation device, to illuminate the substrate 150 positioned thereon so that it can be more easily inspected by the inspection system 200.

The system controller 101 facilitates the control and automation of the overall system 100 and may include a central processing unit (CPU) (not shown), memory (not shown), and support circuits (or I/O) (not shown). The CPU, may be one of any form of computer processors that are used in industrial settings for controlling various chamber processes and hardware (e.g., conveyors, detectors, motors, fluid delivery hardware, etc.) and monitor the system and chamber processes (e.g., substrate position, process time, detector signal, etc.). The memory is connected to the CPU and may be one or more of a readily available memory, such as random access memory (RAM), read only memory (ROM), floppy disk, hard disk, or any other form of digital storage, local or remote. Software instructions and data can be coded and stored within the memory for instructing the CPU.

The support circuits are also connected to the CPU for supporting the processor in a conventional manner. The support circuits may include cache, power supplies, clock circuits, input/output circuitry, subsystems, and the like. A program (or computer instructions) readable by the system controller 101 determines which tasks are performable on a substrate. Preferably, the program is software readable by the system controller 101, which includes code to generate and store at least substrate positional information, the sequence of movement of the various controlled components, substrate inspection system information, and any combination thereof.

In one embodiment, the two processing heads 102 utilized in the system 100 may be conventional screen printing heads available from Applied Materials Italia Srl which are adapted to deposit material in a desired pattern on the surface of a substrate 150 disposed on a processing nest 131 in position "2" or "4" during a screen printing process. In one embodiment, the processing head 102 includes a plurality of actuators, for example, actuators 105 (e.g., stepper motors or servomotors) that are in communication with the system controller 101 and are used to adjust the position and/or angular orientation of a screen printing mask (not shown) disposed within the processing head 102 with respect to the substrate 150 being printed. In one embodiment, the screen printing mask is a metal sheet or plate with a plurality of holes, slots, or other apertures formed therethrough to define a pattern and placement of screen printed material on a surface of a substrate 150. In one embodiment, the screen printed material may comprise a conductive ink or paste, a dielectric ink or paste, a dopant gel, an etch gel, one or more mask materials, or other conductive or dielectric materials.

In general, the screen printed pattern that is to be deposited on the surface of a substrate 150 is aligned to the substrate 150 in an automated fashion by orienting the screen printing mask using the actuators 105 and information received by the system controller 101 from the inspection system 200. In one embodiment, the processing heads 102 are adapted to deposit a metal containing or dielectric containing material on a solar cell substrate having a width between about 125 mm and 156 mm and a length between about 70 mm and 156 mm.

Figure 3:
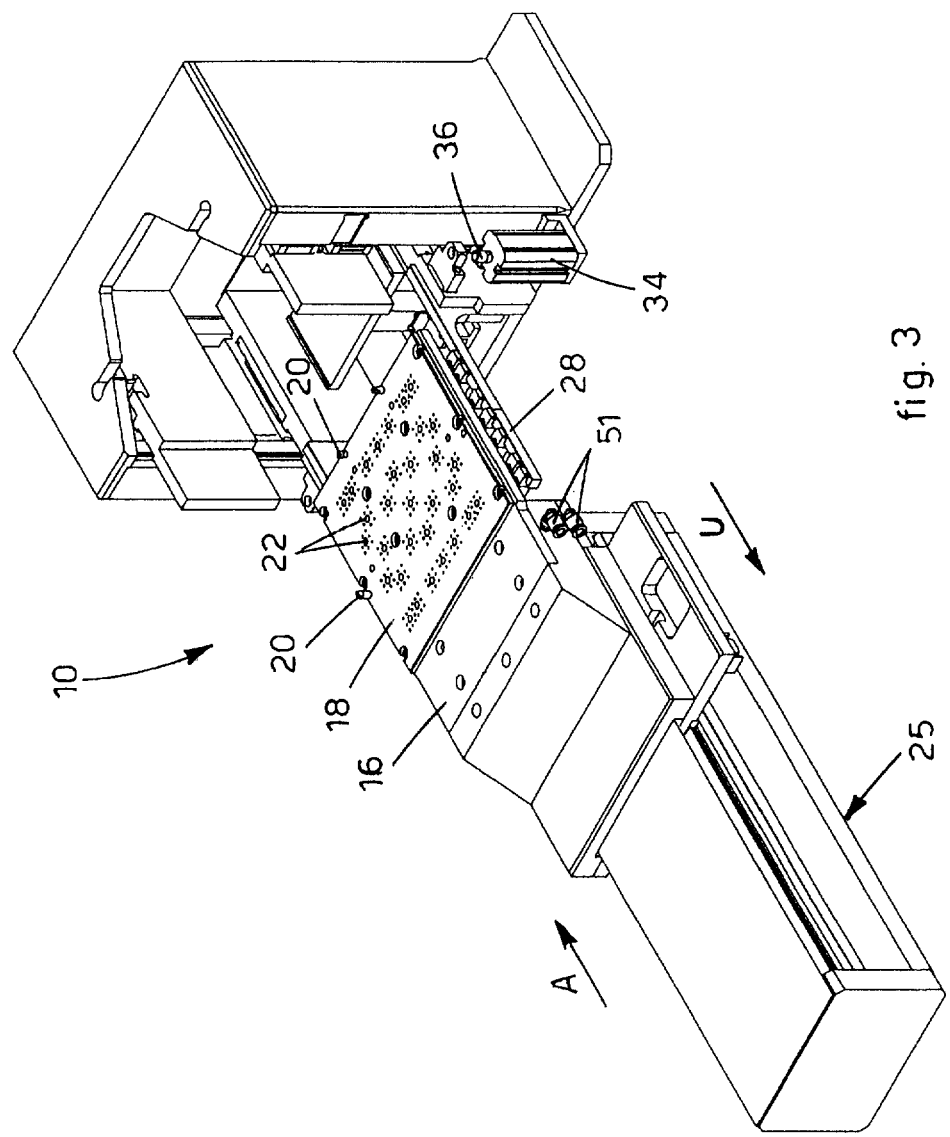
FIG. 3 is a perspective view of the testing apparatus according to the present invention.
Figure 4:
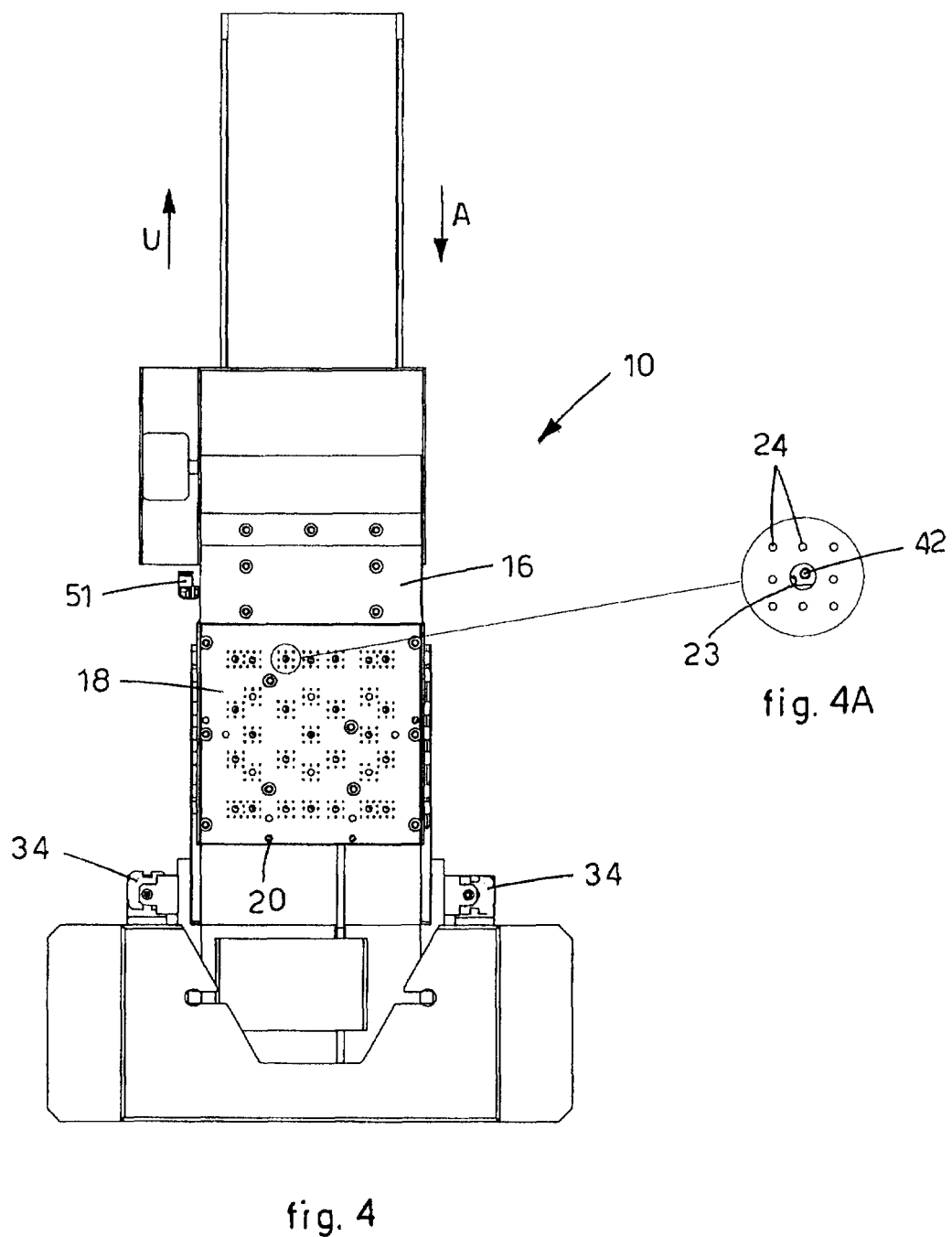
FIG. 4 is a top plan view of the testing apparatus of FIG. 3.
Figure 6:
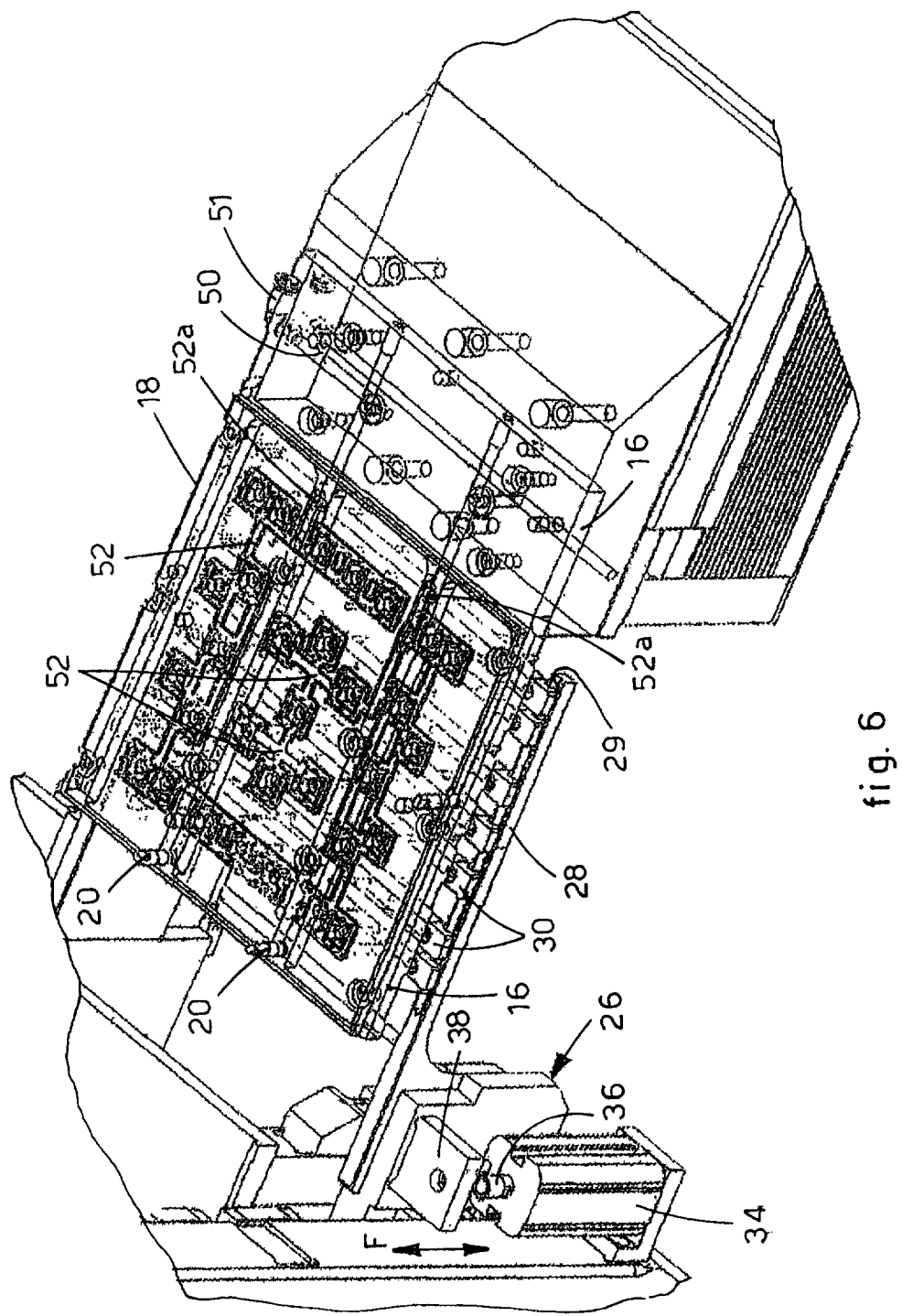
FIG. 6 is a perspective view of part of the testing apparatus according to the present invention.
Figure 7:
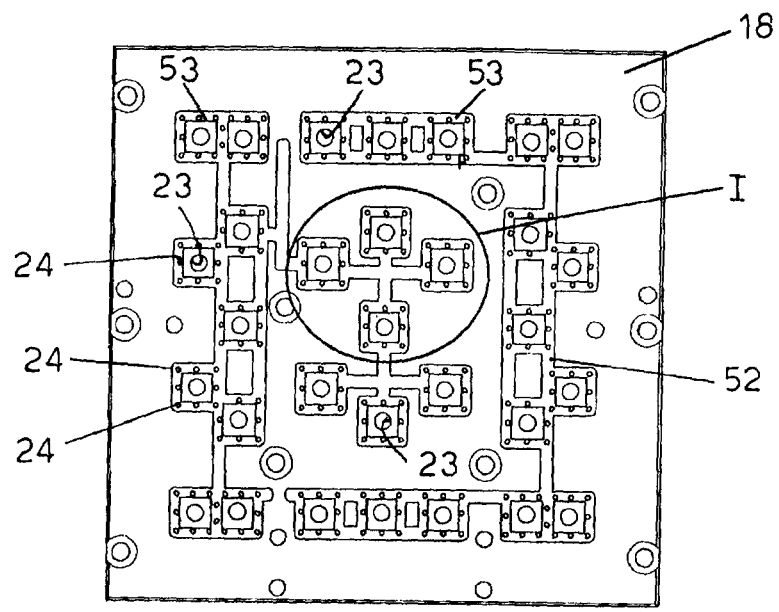
FIG. 7 is a top plan view of a detail of FIG. 6.

The apparatus 10 according to the present invention is generally disposed downstream the exit conveyors 114 and the ovens 199 in the system 100 and comprises a support 16 (FIGS. 3, 4, 6), a supporting nest 18 for each substrate 150 to be tested, a test member 26 provided with probes or needles 42, for the electric testing of the substrate 150, and one or more suction pipes 50 distributed inside the support 16 and operatively connectable to holes 24 in the nest 18.

Each substrate is transferred from the exit conveyor 114 to the supporting nest 18 in a known way, for example by means of an automated transfer system able to move the substrate from the conveyor 114 to the supporting nest 18 and to the support 16.

The support 16, substantially flat, is suitable to support in a horizontal position at least one nest 18 and therefore, as will be described in more detail hereafter, an associated substrate 150. The support 16 is preferably made of steel covered by a first layer of nickel and by a second layer of dielectric varnish, of the known type and easily available on the market, therefore allowing to obtain an efficient and optimal support planarity and an adequate electric insulation of the support 16.

Figure 11:
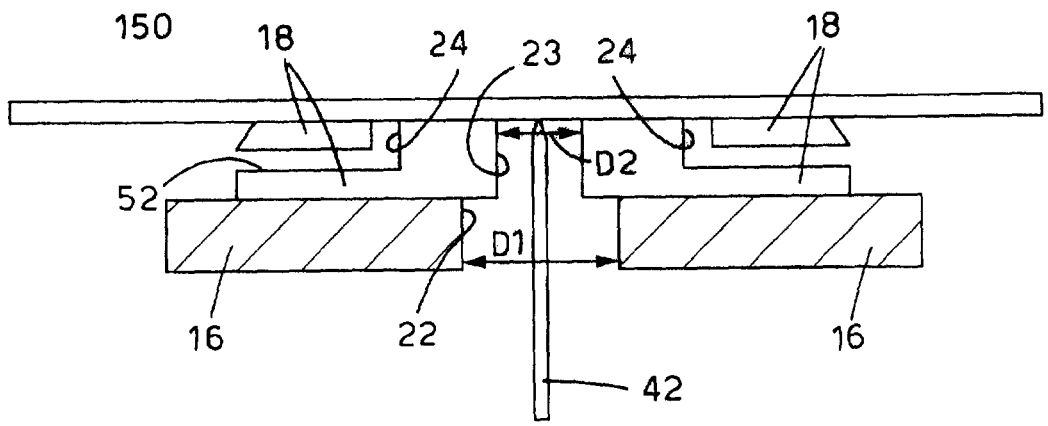
FIG. 11 is a schematic view in section from VI to VI in FIG. 10.

The support 16 is provided with a plurality of first through testing holes 22 (FIG. 11), suitable to allow the passage of at least a corresponding needle 42 of the test member 26, as will be described in more detail hereafter.

The suction pipes 50 (FIG. 6) are also provided with a suction sleeve 51 at one of their ends, in turn connected to a suction member of the known type, not shown, such as a vacuum generator or other suitable device.

Figure 5:
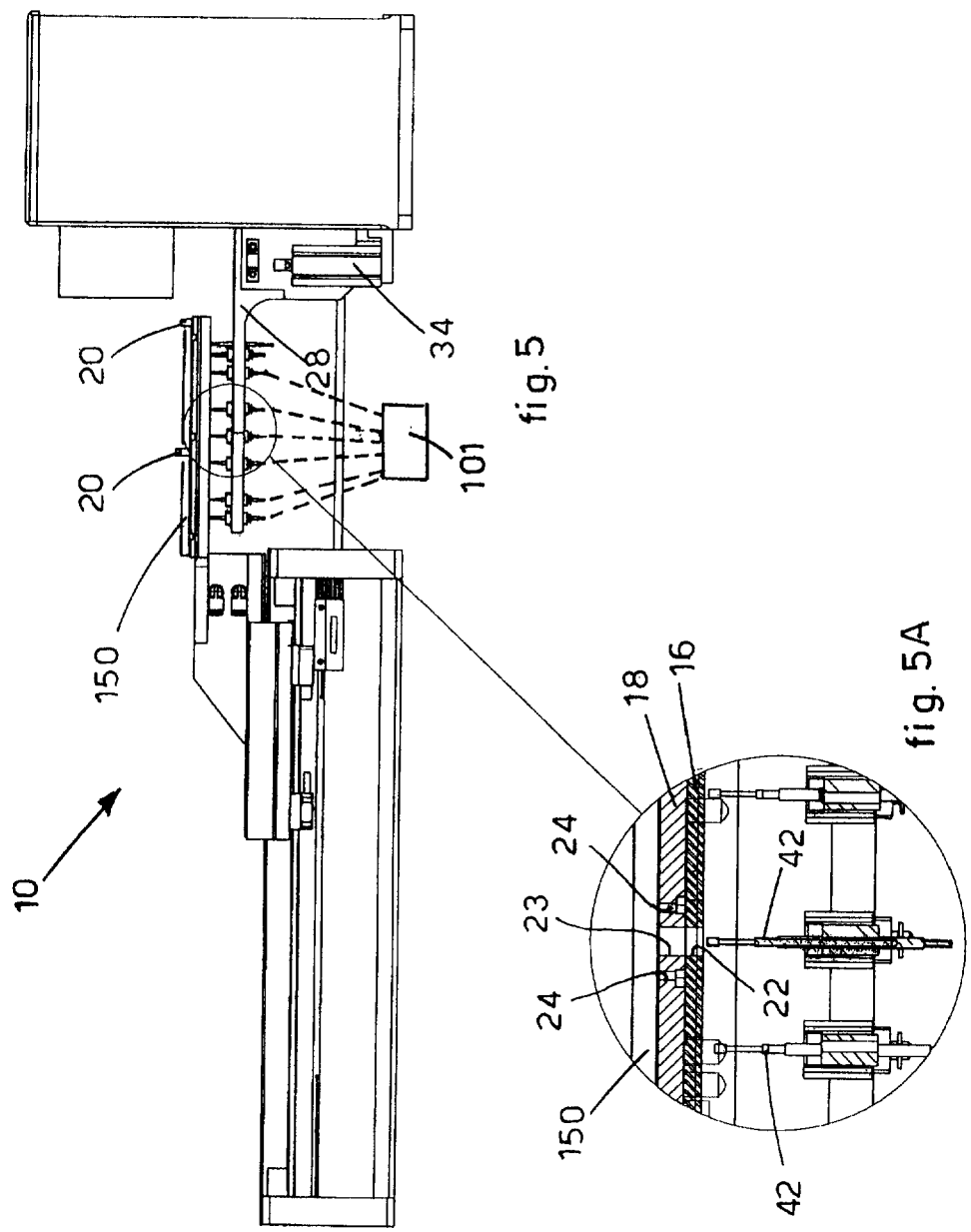
FIG. 5 is a lateral view of FIG. 3.

The nest 18, also substantially flat, has a regular shape, for example rectangular or square, and is made of a non-conductive material, for example Plexiglas. The nest 18 is provided with abutment pins 20 (FIGS. 3, 4 and 5), disposed in predetermined positions on its upper surface, so as to allow a precise positioning of the substrate 150 in a predetermined position and to impede an unwanted horizontal movement thereof during testing.

The disposition of the abutment pins 20 is such as to allow the positioning on the supporting nest 18 of various types of substrate 150 having different formats.

Each supporting nest 18 can also be used for moving an associated substrate 150 also during other working steps, as for example during the step or steps of printing the electric patterns. The nest 18 is moved together with its own substrate 150, by movement means of the known type, such as conveyor belts or conveyors.

The supporting nest 18 is also provided with a plurality of second testing holes 23 (FIGS. 7, 9, 10 and 11), through and disposed in predetermined positions coordinated with the disposition of the first testing holes 22, that is, substantially concentric to them when the nest 18 is positioned on the support 16, so as to allow the passage of at least one needle 42 of the test member 26 both through the first testing hole 22 and the second testing hole 23, as will be described in more detail hereafter.

The diameter D2 of the second hole 23 (FIG. 11) is advantageously smaller than the diameter D1 of the first testing hole 22 so as to allow an easy insertion of a corresponding testing needle 42, even if one or more needles 42 are not perfectly aligned with the holes 22, 23 or have an inclination not perfectly perpendicular to the plane of the support 16. This so as to further reduce the possibility of an undesired contact of each needle 42 with the support 16 or with the nest 18.

The nest 18 is also provided with a suction line 52 (FIG. 6) operatively connectable at predetermined joining points 52a to the suction pipe 50, when the nest 18 is disposed on the support 16.

The suction line 52 develops inside the thickness of the nest 18 so as to define a suction course for the air which is distributed in proximity to each of the second testing holes 23.

The suction line 52, in fact, is provided with suction portions 53 (FIG. 9) which develop around each second hole 23 and surround it. Each portion 53 is connected to the upper surface of the nest 18 by means of a plurality of suction holes 24 (FIGS. 7, 9, 10, 11), suitable to generate a condition of local depression around the second hole 23 on the contact surface of the substrate 150 so as to exert an effective action to hold the substrate on the nest 18 during testing, as will be explained in more detail hereafter.

The suction holes 24 are advantageously distanced in a regular way on the development of each portion 53, so as to generate an effective holding action through depression on the substrate 150 which contrasts locally the mechanical thrusting action exerted by the needles 42.

Figure 9:
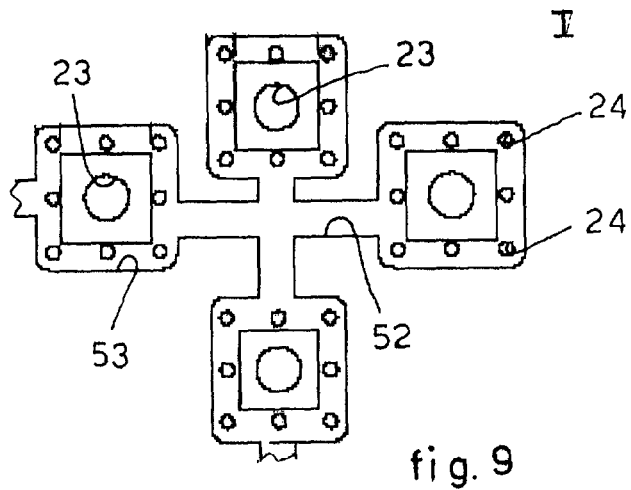
FIG. 9 is an enlarged view from above of a detail of FIG. 7.

According to a first form of embodiment, shown in FIG. 9, each portion 53 has a quadrangular development and the holes 24 are disposed in correspondence with the angles and in intermediate positions along its sides.

Figure 10:
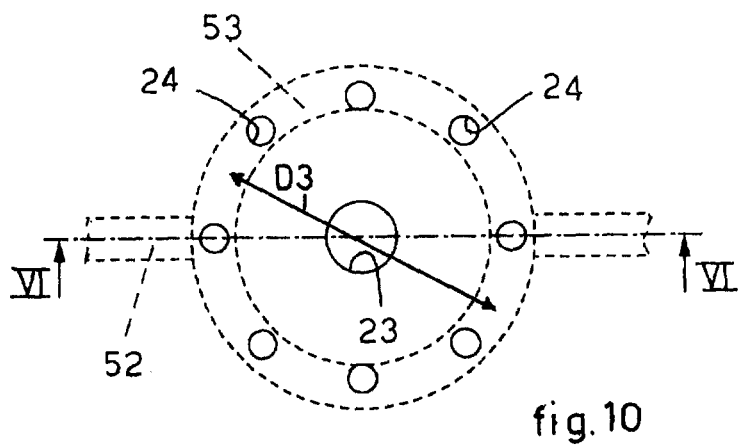
FIG. 10 is a view from above of a variant of the detail in FIG. 9.

According to another form of embodiment, shown in FIG. 10, the portions 53 have a substantially circular development in which the holes 24 are disposed substantially equidistant.

Advantageously the number of holes 24 which guarantees an effective holding action is correlated to the sizes of the portion 53, for example its diameter, to the thrust force of the needles 42, and the holding/depression force exerted, as will be described in more detail hereafter. In one embodiment the number of holes 24 related to each portion 53 is eight.

It is understood that the number of suction holes 24 can be greater or fewer than eight, or that, instead of suction holes 24, a single suction opening can be made, conformed in a circular manner, so as to surround, at least partly, the second hole 23.

Figure 8:
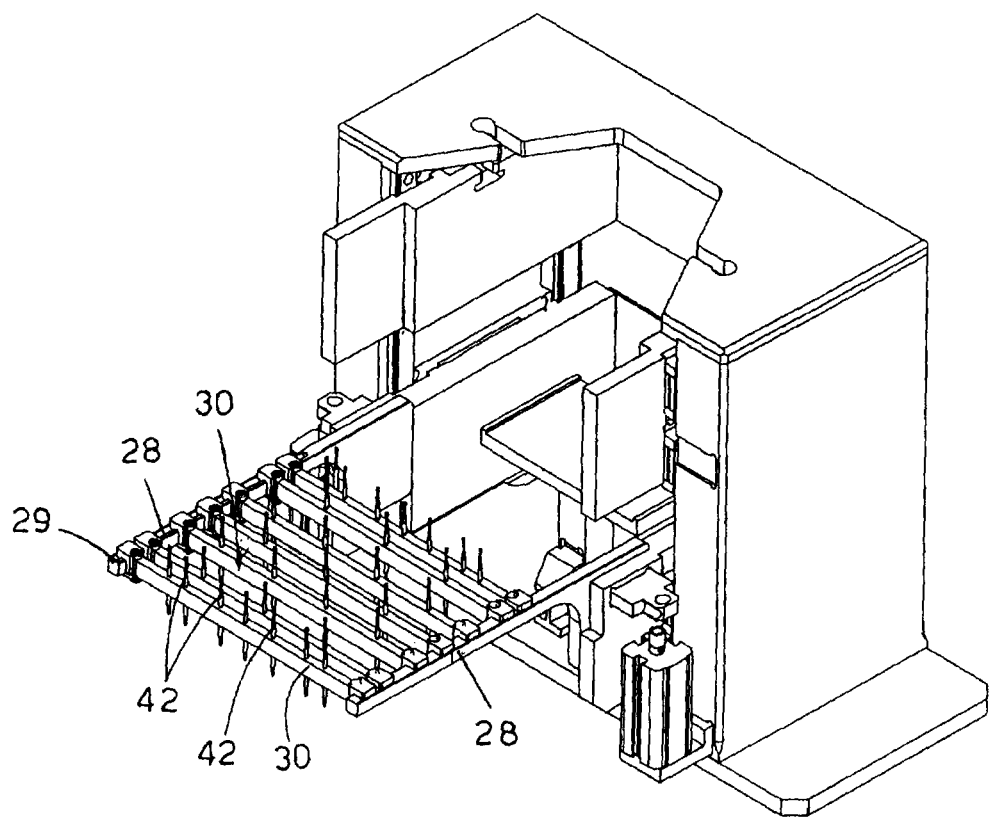
FIG. 8 is a perspective view of a needle supporting member of the apparatus according to the present invention.

The test member 26 (FIGS. 3, 6 and 8) comprises two arms 30, made for example of Plexiglas, disposed parallel and at the same reciprocal height under the support 16. The arms 28 are disposed at a predetermined reciprocal distance so as to support respective bars 30. Each bar 30 is suitable to support a plurality of electric testing needles 42. The number of bars 30 is coordinated to the number of needles 42 on the basis of typology and size of the different substrates 150 to be tested.

The bars 30 are slidingly constrained in correspondence with their opposite ends to sliding guides 29 made on each arm 28. This is to position the bars 30 at regular and predetermined reciprocal distances or in at least partly reciprocal continuity between two or more bars 30, to obtain a desired positioning of the needles 42, consistent with the actual sizes of the substrates 150 to be tested.

The arms 28 are also movable (FIG. 6), substantially in a vertical direction, according to the direction of the arrow F, between a lower position in which the needles 42 are not inserted in the holes 22, 23, and a higher position in which the bars 30 are disposed adjacent to the support 16 to allow the insertion of each needle 42 in a respective pair of holes 22, 23 and therefore allow contact with the zone of the substrate 150 to be tested.

The movement of the arms 28 occurs by means of a pair of actuators 34 of the known type, e.g., air cylinders, electric motors or the like, disposed laterally with respect to the support 16. Each actuator is provided with a vertically movable piston 36 able to cooperate with a horizontal shoulder element 38, solid with a corresponding arm 28 so as to lift and lower them and therefore to position the bars 30 at the desired height.

In a form of embodiment, not shown in the drawings, the bars 30 are replaced by a single flat support structure, constrained along two of its opposite lateral edges to the arms. The needles 42 are distributed on the flat structure according to a predetermined disposition consistent with the different types and sizes of substrates to be tested.

The testing needles 42 are conductive components typically comprising a metallic material and having at least a desired shaped contact point that is configured to achieve a reliable contact with the surface of the substrate 150. Each testing needle 42 is suitable to measure both the voltage and the current in correspondence with the predetermined zone of the substrate 150. Advantageously each needle 42 is provided with two testing probes, not shown in the present drawings, conformed in a point and disposed substantially parallel, of which one is suitable to acquire the value of voltage and the other to acquire the value of electrical current flowing through the contact point that is in contact with the substrate 150.

It is understood that the needle 42 can be of the coaxial type in which a first external probe is suitable to measure the current or tension and a second internal probe is suitable to measure the tension or the current, retractable with respect to the external probe.

Each needle 42 is electrically connected, in a known way, to a processing unit, for example to the system controller 101 or to another controller, able to acquire and process the voltage and current values and verify that these values are within a range provided for the correct functioning of the substrate 150.

The testing apparatus 10 as described heretofore functions as follows.

At the end of a predetermined processing, for example when the substrates 150 exit from the oven 199, or at the end of the production of a solar cell, the substrate 150 is transferred to a supporting nest 18 and transported together with it on the support 16 in the direction indicated by the arrow "A" (FIGS. 3, 4), by means of an actuator, for example a magnetic linear motor 25 which is able to move the support 16. The nest 18 is positioned on the support 16 so as to align the second holes 23 with corresponding first holes 22 and so as to hydraulically connect the line 52 with the pipes 50. In this step the arms 28 are disposed in their lower position, so as to allow an easy positioning of the nest 18 and the substrate 150.

Subsequently the arms 28 are moved by the actuators 34 into their higher position so as to allow the insertion of each needle 42 in a corresponding pair of holes 22, 23, and therefore the contact with a corresponding area of the surface of the lower side of the substrate 150.

In coordination with the movement of the arms 28, the suction member is activated so as to generate a depression in the pipes 50, in the line 52 and therefore in the corresponding portions 53. This allows one to obtain a holding action distributed in a uniform and regular way both around each hole 23, and exerted by depression by means of the suction holes 24 surrounding each hole 23, and also a uniform holding action carried out directly on the whole surface of the lower side, i.e. the backside, of the substrate 150. This allows to hold the substrate 150 in an efficient and secure way, and therefore the nest 18, to the support 16 during the electric testing.

The holding action is made in such a way as to contrast the overall mechanical thrust exerted by the testing needles 42 which are disposed in contact with the areas of the substrate 150 to be tested. In this way it is possible to maintain the substrates 150 in one fixed position during testing, avoiding possible wrong measurements.

Moreover, by regulating the intensity of the depression it is also possible to regulate the holding action, according to the mechanical thrust action of the needles 42, thus obtaining a cushioning action on the substrate 150 which allows to minimize possible breakages and/or cracks of the fragile crystalline structure of the substrate 150.

The number of holes 24 which guarantees an effective holding action is correlated to the sizes of the portion 53, for example its diameter, to the thrust force of the needles 42, and the holding/depression force exerted. In fact, considering that the substrate 150 is constrained, in correspondence with the holes 24, to the support plane, the maximum force that the needle 42, or one of its springs, of the known type and not shown in the figures, exerts on the substrate, and the ultimate tensile stress of the material that makes up the substrate, are taken as known. By fixing a safety coefficient, defined as the ratio between ultimate tensile stress, expressed in [N/mm2], and the admissible mechanical tension, it is possible to calculate the positioning diameter of the holes 24 along the portion 53. Said diameter must be carefully verified since the force exerted by the needle 42 could be such as to cause a curvature deformation so that the holding force given by the vacuum, that is, by the maximum value of vacuum obtained as the sum of the line vacuum pressure and load losses of the suction pipe 50 and the suction line 52, is not able to hold the substrate constrained to the support nest 18. In this case it is necessary to provide a reduction in the diameter of the circumference of development of the portion 53 where the holes 24 are positioned.

On the contrary, repeating the calculations after having fixed the value of said diameter, we obtain a new safety coefficient, which must not be lower than a limit value, otherwise the substrate 150, or cell, could break.

The minimum diameter D3 of the circumference of development of the portion 53 is also determined by a dynamic condition: in the case of small diameters the substrate 150 disposed on the nest 18, given the same stress, is subjected locally to a lesser deformation, which gives a lesser cushioning. This in turn entails that the impact between each needle 42 and the substrate is less cushioned, and can cause the substrate to break.

According to these considerations it has been calculated that: the ratio K1 between the number of holes 24 and the diameter D3 of the portion 53 is equal to 0.5 mm-1; the ratio K2 between said diameter D3 and the total area of the holes 24 is equal to about 0.92 mm-1.

In one embodiment, the number of holes 24 is between five and ten. In one embodiment, the number of holes 24 is eight.

The testing of the substrate 150 is performed in a known way, measuring voltage and current between predetermined contact points of the substrates, so as to measure, for example, the resistance of the screen patterned layer and/or the surface resistance of the doped portions of the substrate 150.

At the end of the acquisition/measuring of the voltage and current values the arms 28 are moved into their lower position by means of the actuators 34, so as to allow the extraction of each needle 42 from the corresponding pair of holes 22, 23.

In coordination with the movement of the arms 28, the depression member is deactivated, allowing the subsequent movement of the nest 18 and the substrate 150 in the direction indicated by the arrow "U" and the transfer of the substrate 150 for example toward a subsequent process, or in the case of a defective substrate 150 to a discharge station for discards.

Provided herein is a testing apparatus used in a plant to produce substrates (150) for solar cells, or other electronic devices, comprising a support (16), substantially flat and able to support, directly or indirectly, on a surface thereof at least a substrate (150) or other device to be electrically tested, a supporting nest (18) for each substrate (150) to be tested, and a plurality of testing probes (42), said support (16) comprising a plurality of through holes (22), each suitable for the insertion of a corresponding testing probe (42), to allow the connection of each probe (42) to a corresponding and predetermined testing area of the substrate, characterized in that it comprises suction means (50), distributed inside the support (16) from the same side where the testing probes (42) are located, operatively connectable to suction holes (24) provided in the nest (18) through a suction line (52), each of said nest (18) comprising testing holes (23) suitable to be aligned, in use, to the testing holes (22) provided in the support (16) to allow the passage through of the relative testing probe (42), the suction means (50) exerting through said suction line (52) and said suction holes (24) in the nest (18) a holding action through depression on one face of the substrate (150), to contrast the thrust action exerted by the testing probes (42) on said testing areas.

The apparatus is characterized in that said suction means (50) are disposed in cooperation with each through hole (22) of the support (16).

The apparatus is characterized in that the suction line (52) develops in the nest (18) so as to define a suction path distributed in proximity with each of said testing holes (23).

The apparatus is characterized in that the suction line (52) is provided with suction portions which develop around each of said testing holes (23), at least partly surrounding it, each portion being connected to the upper surface of the nest (18) by means of said suction holes (24).

The apparatus is characterized in that said suction portion is a quadrangular shape.

The apparatus is characterized in that said suction portion is a circular shape.

The apparatus is characterized in that the number of suction holes (24) goes from five to ten.

The apparatus is characterized in that the number of suction holes (24) is eight.

The apparatus is characterized in that the suction holes (24) are distanced in a regular way along the development of each suction portion.

The apparatus is characterized in that the support (16) is made of at least partly non-conductive material.

Provided herein is a method for testing substrates (150) of solar cells, or other electronic devices, comprising a step in which a substrate (150) to be tested electrically is disposed on a supporting nest (18) and then the nest (18) is positioned on a support (16), substantially flat, comprising a plurality of through testing holes (22), each suitable for the insertion of a corresponding testing probe (42) of a plurality of testing probes (42), each of said nest (18) comprising testing holes (23) suitable to be aligned, in use, to the testing holes (22) provided in the support (16) to allow the passage through of the relative testing probe (42), a testing step in which at least some of the testing probes (42) are inserted in said corresponding testing holes (22, 23) to be connected and put in contact with a corresponding testing area of the substrate (150), characterized in that it comprises a suction step in which by means of suction means (50), associated with the support and comprising a suction line (52) and suction holes (24) provided in each of said nest (18), a holding action through depression is exerted on one side of the substrate to contrast the thrust action exerted by the testing probes (42) on the testing areas.

The method is characterized in that said suction means (50) are disposed in cooperation with each through hole (22) of the support (16)

It is clear that modifications and/or additions of parts or steps may be made to the testing apparatus 10 as described heretofore, without departing from the field and scope of the present invention.

It is also clear that, although the present invention has been described with reference to some specific examples, a person of skill in the art shall certainly be able to achieve many other equivalent forms of testing apparatus and relative testing method, having the characteristics as set forth in the claims and hence all coming within the field of protection defined thereby.

The invention claimed is:

1. An apparatus for testing a characteristic of a substrate, comprising:
   an actuator;
   a supporting nest having a surface for supporting a substrate thereon, wherein the supporting nest comprises:
      a plurality of testing holes; and
      a plurality of suction holes, wherein the plurality of testing holes and the plurality of suction holes are formed through the surface of the supporting nest; and
      a suction line connected to a suction device, the suction line including a plurality of suction portions connecting the suction line to the plurality of suction holes, wherein each testing hole is at least partially surrounded by a different suction portion; and
   a plurality of testing probes that are supported by one or more movable arms that are coupled to the actuator, wherein each of the testing probes are positioned so that each testing probe is configured to pass through at least a portion of a corresponding testing hole of the plurality of testing holes when the actuator moves the one or more movable arms relative to the supporting nest, wherein
      the plurality of testing probes consists of all testing probes that are configured to be moved through the surface of the supporting nest; and
      the plurality of testing holes consists of all holes that the corresponding testing probes of the plurality of testing probes are configured to be moved through when the corresponding testing probes are moved through the surface of the supporting nest.

2. The apparatus of claim 1, further comprising a support having a surface on which the supporting nest is disposed, wherein the support comprises a plurality of through holes, and each of the plurality of through holes are aligned with a testing hole.

3. The apparatus of claim 1, wherein the plurality of testing probes are aligned in a pattern so that the plurality of testing probes are configured to contact a plurality of predetermined testing zones formed on the surface of the substrate.

4. The apparatus of claim 1, wherein the actuator is coupled to a movable piston configured for moving the movable arms.

5. The apparatus of claim 1, wherein the movable arms comprise a plurality of bars that are configured to support the plurality of testing probes thereon.

6. The apparatus of claim 1, wherein a plurality of suction holes are positioned around each at least one testing hole.

7. The apparatus of claim 6, wherein the plurality of suction holes positioned around at least one testing hole are disposed in a pattern selected from the group consisting of a quadrangular shape, a circular shape and combinations thereof.

8. The apparatus of claim 6, wherein the number of suction holes that are positioned around at least one testing hole is selected from the group consisting of five, six, seven, eight, nine, and ten.

9. The apparatus of claim 1, wherein the suction device is coupled to the suction holes for exerting a holding action to a first surface of the substrate.

10. The apparatus of claim 1, wherein the supporting nest comprises a non-electrically conductive material.

11. The apparatus of claim 1, wherein each testing hole is surrounded by only one suction portion.

12. A method of measuring an electrical property of a surface of a substrate, comprising:
   disposing the substrate on a surface of a supporting nest, wherein the supporting nest comprises:
      a plurality of testing holes and a plurality of suction holes formed therein; and
      a suction line connected to a suction device, the suction line including a plurality of suction portions connecting the suction line to the plurality of suction holes, wherein each testing hole is at least partially surrounded by a different suction portion;
   retaining the substrate on the surface of the supporting nest by creating a pressure below atmospheric pressure in the suction holes; and
   moving each of a plurality of testing probes through a corresponding testing hole of the plurality of testing holes until the plurality of testing probes contact a plurality of predetermined testing zones formed on a first surface of the substrate, wherein
      the plurality of testing probes consists of all testing probes that are configured to be moved through the surface of the supporting nest; and
      the plurality of testing holes consists of all holes that the corresponding testing probes of the plurality of testing probes are configured to be moved through when the corresponding testing probes are moved through the surface of the supporting nest.

13. The method of claim 12, wherein each of the plurality of the testing probes are supported by one or more bars coupled to an actuator, and wherein moving each testing probe comprises moving the one or more bars using the actuator.

14. The method of claim 12, wherein the supporting nest further comprises a plurality of suction assemblies, and each suction assembly comprises at least one of the testing holes and a plurality of suction holes that are positioned around at least one testing hole.

15. The method of claim 14, wherein the number of suction holes that are positioned around at least one testing hole in each suction assembly are selected from the group consisting of five, six, seven, eight, nine and ten.

16. The method of claim 12, wherein moving each of the plurality of testing probes further comprises applying a thrusting force to the first surface of the substrate by use of an actuator.

17. The method of claim 16, further comprising measuring an electrical value of the plurality of the predetermined testing zones on the first surface of the substrate using the plurality of the testing probes.

18. The method of claim 17, wherein the electrical value is selected from the group consisting of a voltage value, a current value, and a combination thereof.

19. The method of claim 12, wherein each testing hole is surrounded by only one suction portion.

* * * * *